United States Patent

Ito et al.

[11] Patent Number: 6,100,536
[45] Date of Patent: Aug. 8, 2000

[54] ELECTRON FLOOD APPARATUS FOR NEUTRALIZING CHARGE BUILD-UP ON A SUBSTRATE DURING ION IMPLANTATION

[75] Inventors: Hiroyuki Ito, Horsham, United Kingdom; Xue-Yu Qian, Milpitas, Calif.; Robert J. Mitchell, Pulborough; Stephen Moffatt, Bookham, both of United Kingdom

[73] Assignee: Applied Materials, Inc., Santa Clara, Calif.

[21] Appl. No.: 09/081,596

[22] Filed: May 20, 1998

[30] Foreign Application Priority Data

May 20, 1997 [GB] United Kingdom .................. 9710380

[51] Int. Cl.⁷ .................................................. H01J 37/317
[52] U.S. Cl. ...................................... 250/492.21; 250/251
[58] Field of Search ............................. 250/492.21, 251, 250/398

[56] References Cited

U.S. PATENT DOCUMENTS

| | | |
|---|---|---|
| 4,992,665 | 2/1991 | Möhl . |
| 5,089,710 | 2/1992 | Kikuchi et al. . |
| 5,107,170 | 4/1992 | Ishikawa et al. . |
| 5,343,047 | 8/1994 | Ono et al. .......................... 250/492.21 |
| 5,399,871 | 3/1995 | Ito et al. . |
| 5,446,929 | 9/1995 | Sakai et al. . |
| 5,466,929 | 11/1995 | Sakai et al. . |
| 5,468,955 | 11/1995 | Chen et al. .............................. 250/251 |
| 5,545,257 | 8/1996 | Vella . |
| 5,576,538 | 11/1996 | Sakai et al. . |

FOREIGN PATENT DOCUMENTS

| | | |
|---|---|---|
| 0665306A1 | 8/1995 | European Pat. Off. . |
| 703597A1 | 9/1995 | European Pat. Off. . |
| 2194857A | 7/1987 | United Kingdom . |
| 2235086A | 2/1991 | United Kingdom . |

OTHER PUBLICATIONS

5–47338(A) Ion Beam Neutralizing Device, filed Aug. 16, 1991 –Japan—Abstract only.

4–351838(A) Neutralization Unit Of Beam Device, filed May 28, 1991—Abstract only.

Filamentless Neutralization Of Broad Ion Beams, D. Korzec et al., Microstructure Research Center, University of Wuppertal, Germany, Jun. 15, 1991.

Technology and Application Of Filamentless RF—Ion Sources In Ion Beam Sputter Deposition, J. Engemann, Microstructure Research Center, University of Wuppertal, Germany, 1993.

*Primary Examiner*—Kiet T. Nguyen
*Attorney, Agent, or Firm*—Boult Wade Tennant

[57] ABSTRACT

An Electron flood apparatus for neutralizing positive charge build-up on substrate during implantation of ions in a substrate by ion beam implantation apparatus. The electron flood apparatus comprises a tube for axially receiving and passing an ion beam to a substrate, an opening in a sidewall of the tube, a plasma chamber having an exit aperture in communication with said opening of said tube, a supply of inert gas to said plasma chamber, a high frequency power generator, and means to deliver high frequency power from said generator to maintain a plasma in said chamber to produce low energy electrons, whereby a flux of said low energy electrons emerges from said chamber through said exit aperture into said tube to merge with the ion beam.

21 Claims, 1 Drawing Sheet

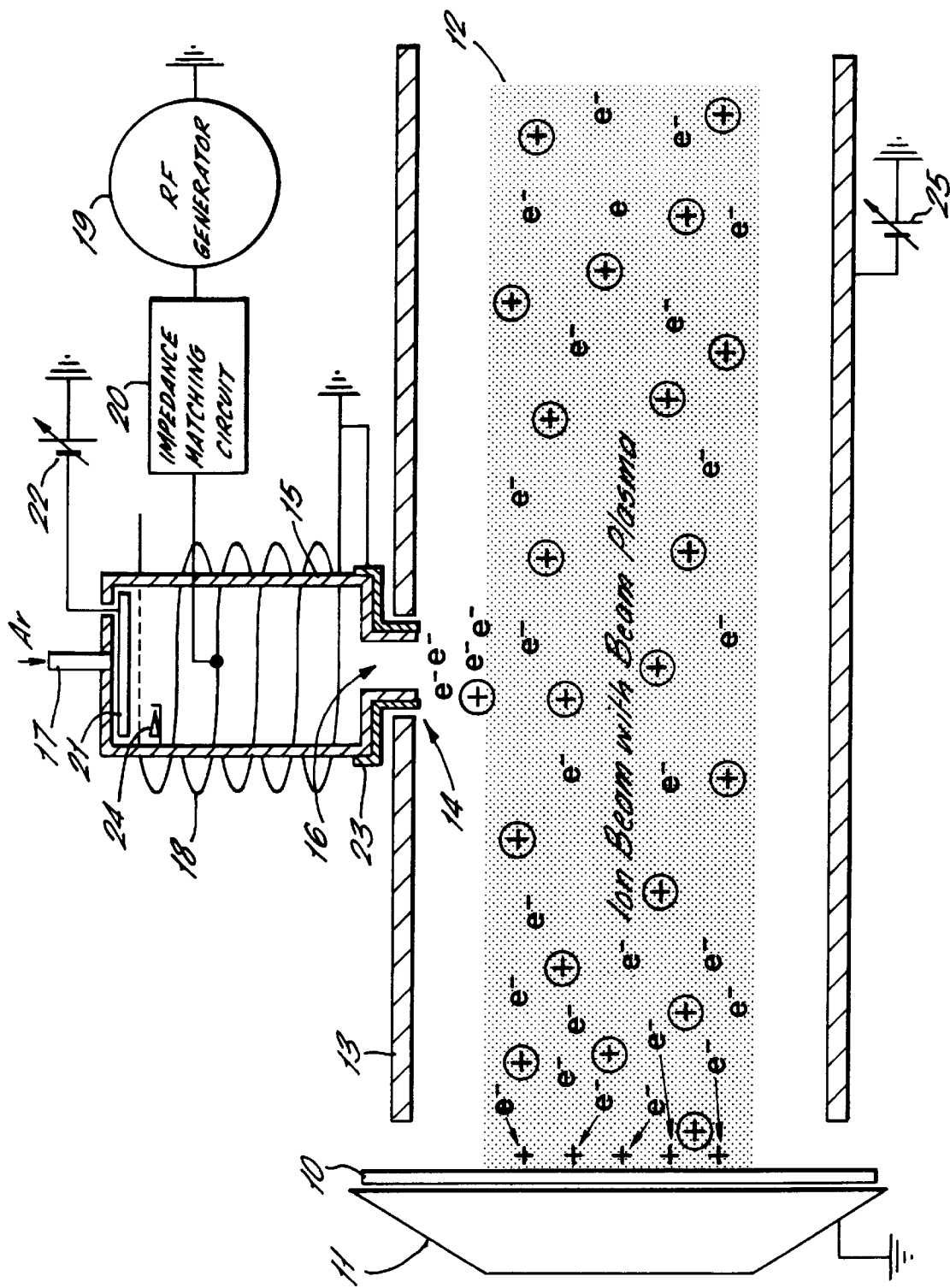

ELECTRON FLOOD APPARATUS FOR NEUTRALIZING CHARGE BUILD-UP ON A SUBSTRATE DURING ION IMPLANTATION

FIELD OF THE INVENTION

The present invention relates to electron flood apparatus for neutralising positive charge build-up on a substrate during implantation of ions in the substrate by ion beam implantation apparatus.

DISCUSSION OF THE PRIOR ART

In the manufacture of semiconductor devices, an increasingly popular processing technology is ion beam implantation whereby a beam of desired impurity ions is directed at the semiconductor substrate so that the ions become implanted in the substrate to create regions of a desired conductivity type, for example. Some regions of the substrate being implanted will be electrically insulated from the main body of the semiconductor substrate. As a result, during implantation with ions, such regions become progressively charged. Usually the implanted ions are positive so that positive charge build-up on the substrate surface occurs. If this charge build-up exceeds the breakdown voltage of insulated layers and regions in the substrate, damage is caused.

There is thus a known requirement to neutralise charge build-up on the surface of substrates during ion implantation.

Known techniques for neutralising this charge build-up involve flooding the region of the ion beam immediately in front of the substrate with electrons. Any positive charge build-up on the substrate tends to attract these electrons to the substrate surface to discharge the surface. Examples of electron flood apparatus, also known as plasma flood guns, are disclosed in US5089710 and US5399871.

In order to be effective, these electron flood systems used for substrate neutralisation, must produce relatively low energy electrons, which can then readily be attracted to the substrate by relatively small positive charges arising on the substrate. Further, excessively energetic electrons in front of the substrate can impinge upon and "stick" to the substrate surface even though any positive charge on the substrate surface has already been fully discharged, and thereby build-up an excess negative electrostatic charge on the surface. The degree to which such a negative electrostatic charge can accumulate on the substrate surface is related to the energy of the electrons in the region in front of the substrate.

It is thus an important criterion for successful electron flood apparatus that the electrons produced to flood the region in front of the substrate where the ion beam impinges upon the substrate, should be of very low energy.

Another problem which can arise from the prior electron flood apparatus is the possibility of contamination arising from the hot metal components in the plasma chamber used for prior art flood systems, particularly the tungsten filaments.

With the continuing trend to smaller semiconductor device geometries, there is an increasing need to reduce or eliminate unwanted contaminants in all semiconductor processes.

SUMMARY OF THE INVENTION

The present invention provides an electron flood apparatus for neutralising positive charge build-up on a substrate during implantation of ions in the substrate by ion beam implantation apparatus, the apparatus comprising a tube for axially receiving and passing an ion beam to a substrate, an opening in a sidewall of the tube, a plasma chamber having an exit aperture in communication with said opening of said tube, a supply of inert gas to said plasma chamber, a high frequency (h.f.) power generator, and means to deliver h.f. power from said generator to maintain a plasma in said chamber to produce low energy electrons, whereby a flux of said low energy electrons emerges from the chamber through said exit aperture into said tube to merge with the ion beam. The term "h.f. power" used above and elsewhere herein is intended to cover power at both ordinary radio frequencies which would be coupled capacitively or inductively to plasma in the chamber, and microwave frequencies. The use of a radio frequency (r.f.) or microwave maintained plasma in the plasma chamber of the electron flood apparatus minimises the risk of unwanted contaminants reaching the substrate. The plasma chamber has no hot filament which in prior art devices can cause tungsten contamination.

Also, in the absence of a substantial DC electrical field, electrons in the plasma chamber are not accelerated to excessive energies which can cause energetic electrons to exist in the region of the beam plasma in front of the substrate.

Said means to deliver h.f. power may comprise electrodes within said chamber to couple r.f. power capacitatively to said plasma. Then, a magnetic field may be required in the chamber to confine the plasma electrons. The magnetic field may be produced by one or more permanent magnets or by an electro-magnet.

Preferably, however, said means to deliver h.f. power comprises a coil surrounding the plasma chamber to couple r.f. power inductively to said plasma. This arrangement avoids the need for substantial electric fields to be generated within the plasma chamber which could also cause excessive energy to be delivered to electrons, and also obviates the need for any additional means to provide a confining magnetic field. The r.f. magnetic field itself effectively confines plasma electrons as required.

For microwaves, the means to deliver h.f. power may comprise a magnetron and a waveguide to deliver microwave power from the magnetron to the plasma chamber.

In a preferred embodiment, the apparatus includes an electrode within said plasma chamber connected to conduct a positive current to ground from ions discharging on the electrode, whereby electron flux through said exit aperture is controlled. By absorbing some positive ions from the plasma within the plasma chamber, the flux of electrons through the exit aperture can be controlled and enhanced as necessary. Said electrode may be biased at a negative voltage relative to the substrate potential and may be located in said plasma chamber opposite said exit aperture.

A plasma ignitor may be provided in said plasma chamber if the application of h.f. energy alone is inadequate to initiate the plasma. Once initiated, the plasma is maintained solely by the h.f. energy.

In a further embodiment, said plasma chamber is made of refractory dielectric material and has an electrically conducting shield on an exterior wall portion of the chamber around said exit aperture, said shield being arranged to conduct away any electrostatic charge which could otherwise accumulate on the chamber wall around the exit aperture. The shield may be connected to the substrate potential or to the potential of said tube.

Preferably, said tube is biased at a negative voltage relative to the substrate potential.

BRIEF DESCRIPTION OF THE DRAWING

Examples of the present invention will now be described with reference to the accompanying drawing which illustrates schematically an electron flood installation embodying the present invention installed in front of the substrate of an ion implantation apparatus.

DESCRIPTION OF THE PREFERRED EMBODIMENTS

In the drawing, a substrate comprising a semiconductor wafer 10 is mounted on a wafer support 11. All the elements illustrated in the drawing are provided in the process chamber of an ion implantation machine. The process chamber is evacuated to a desired low pressure as usual for ion implantation. The entire ion implantation machine comprises a source of ions of a species desired for implantation in the wafer 10, such as $B^+$, $BF_2^+$, $P^+$ or $As^+$. Ions are extracted from the source to form a beam which is then passed through a mass analyser and a mass selector to provide a continuing beam of ions of the required mass. After mass selection, and possibly further acceleration or deceleration of the ions in the beam to the desired implant energy, the beam, shown at 12 in the diagram, is delivered to the wafer 10. Scanning arrangements may be provided to ensure that all parts of the wafer 10 receive an equal dose of ions from the beam 12.

As the positive ions of the beam 12 impinge upon and become implanted in the surface regions of the wafer 10, a positive charge tends to accumulate, especially on parts of the surface of the wafer 10 which may be insulated from the main body of the semiconductor material forming the wafer. The wafer support 11 and the body of the wafer 10 are usually connected to ground. As explained above, if this positive charge build-up is allowed to continue, the charge may exceed the breakdown voltage of the insulation and cause damage to parts of the wafer.

In the arrangement shown in the Figure, an electron confinement tube 13 is located immediately in front of the wafer 10 and arranged to be co-axial with the incoming beam 12 of positive ions. An opening 14 is provided in the cylindrical sidewall of the tube 13. A plasma chamber 15 is mounted on the exterior of the confinement tube 13 and has an exit aperture 16 at one end of the chamber 15 which communicates through the opening 14 in the sidewall of the confinement tube 13. A supply of argon gas is fed to the interior of the plasma chamber 15 by a feed duct 17. A radio frequency coil 18 is wound around the exterior of the plasma chamber 15 and is driven with r.f. power from an r.f. generator 19 connected to the coil 18 via an impedance matching circuit 20. A plasma formed in the plasma chamber 15 is maintained by the r.f. energy from the r.f. generator 19 inductively coupled to the plasma by the coil 19.

Low energy electrons are produced in the plasma in the plasma chamber 15 and these electrons tend to drift through the exit aperture 16 of the plasma chamber 15 to merge with the plasma of the ion beam 12. Thus, the density of low energy electrons in the region of the beam 12 in front of the wafer 10 can be enhanced. Then, any positive charge building on the surface of the wafer 10 attracts these low energy electrons from the beam plasma to discharge the wafer surface.

The flux of electrons from the plasma chamber 15 to the beam 12 may be controlled by adjusting the flow of argon into the plasma chamber or the r.f. power and/or frequency. However, in this embodiment, an electrode 21 which may be negatively biased relative to ground by a power supply 22, is provided at the end of the plasma chamber 15 opposite to the exit aperture 16. The electrode 21 enables the charge on some positive ions in the plasma chamber 15 to be absorbed and conducted to ground, thereby discharging these ions. The positive current from the plasma to ground via the electrode 21 should provide a corresponding net flow of electrons through the exit aperture 16. It will be understood that in this embodiment, the plasma chamber 15 itself is made of a refractory dielectric material.

In this way, the electrode 21 can be used to control the flux of electrons from the plasma chamber into the beam 12.

In the arrangement illustrated, the wafer 10 and its support 11 are held at ground potential and so the electrode 21 is held at a negative voltage relative to ground of between 0 and −50 volts, depending on the flux of electrons required.

It will be appreciated that the plasma itself within the plasma chamber 15 is a good electrical conductor. The plasma formed in the plasma 15 extends out through the exit aperture 16 to form a plasma bridge to the plasma of the beam 12. Thus, most of the potential difference between the beam potential and the potential of the electrode 21 will appear as an electric field in the "plasma sheath" region immediately adjacent the electrode 21. As a result, most of the electrons generated in the plasma within the plasma chamber 15 will not experience any electric field caused by the potential on the electrode 21. Only sufficient excess electrons to balance the argon ions being neutralised at the electrode 21 migrate through the exit aperture 16 without any substantial increase in energy.

In order to prevent a net electrostatic charge building up on the surface of the plasma chamber 15 in the region of the exit aperture 16, the external surface of the plasma chamber around the exit aperture 16 is coated or covered with a conductive screen 23 which is connected to ground.

It will also be appreciated that, although there can be sufficient inductive coupling between the r.f. coil 18 and the plasma within the plasma chamber 15 to maintain an existing plasma, special arrangements may be required to ensure ignition of the plasma. In the figure, an ignitor 24 is provided which may comprise a sharp or pointed conducting element within the plasma chamber which may be connected to ground or to an elevated voltage.

Instead, it may be possible to ignite the plasma by initially adjusting the argon pressure within the plasma chamber to a level at which a plasma can be more readily formed, and then changing the pressure to the desired operating pressure.

When a plasma is formed in the plasma chamber 15, the plasma species, both argon ions and electrons, tend to migrate through the exit aperture 16 to form a plasma bridge with the beam 12. Because of the increased mobility of electrons compared to argon ions, the flux of electrons from the plasma chamber 15 is naturally much higher than the flux of ions, by as much as two orders of magnitude. This would tend to result in the plasma within the plasma chamber 15 becoming positively charged, which would in turn reduce and eventually stop the flow of electrons through the exit aperture 16. The presence of the electrode 21 can discharge the plasma so that the flow of electrons through the exit aperture 16 can be maintained at a controlled rate.

The electron flux from the plasma chamber 15 can also be controlled by adjusting the feed of argon gas or by adjusting the level of r.f. power or frequency coupled to the plasma.

In the arrangement illustrated in the figure, the confinement tube 13 is itself biased relative to ground by a power supply 25. The power supply 25 applies a bias voltage of between 0 and −30 volts relative to ground and serves to keep low energy electrons in the region of the ion beam.

Further, the slight negative bias on the confinement tube 13 relative to the wafer 10 can be used to encourage electrons from the beam plasma to migrate onto the surface of the wafer 10.

In addition to negatively biasing the confinement tube 13, magnets may be provided around the confinement tube 13 to confine electrons to the region of the ion beam 12.

In other embodiments, the tube 13 may be configured as part of a Faraday cup for beam current measurement purposes, and may then be held at the same potential as the wafer 10 or even at a positive potential relative to the wafer.

It will be appreciated that the r.f. magnetic field produced in the plasma chamber 15 by the coil 18 will itself confine plasma electrons produced to migrate substantially in the direction of the axis of the coil 18, so that electrons pass through the exit aperture 16 to merge with the beam. Accordingly, no additional magnetic field generating arrangement is required for the plasma chamber 15.

The plasma chamber 15 may conveniently be formed of quartz or a ceramic such as alumina. The frequency of the r.f. generator 19 may conveniently be between 10 and 50 MHz at a power of between 500 watts and 1 kW.

In other arrangements the r.f. power may be capacitively coupled to the plasma by means of electrodes located in the plasma chamber. If both the r.f. power delivery electrodes have insulating surfaces, a further control electrode, similar to electrode 21 described above, may be provided to absorb the charge on positive ions and control the flux of electrons from the chamber.

Instead of r.f. power, microwave power may be used, employing a magnetron and a waveguide or other transmission line to conduct the power to the plasma chamber. Conveniently then, a static magnetic field is also provided in the plasma chamber by a fixed magnet or magnets, or one or more electromagnets. The magnetic field in the plasma chamber should be selected to produce electron cyclotron resonance at the frequency of the delivered microwave energy. If the magnetron frequency is about 2.45 GHz, then the magnet or magnets should produce a field in the chamber of about 875 Gauss. Energy absorption by the plasma is then enhanced, allowing the use of a lower gas pressure in the plasma chamber.

In the example of the present invention described above, the ion beam is essentially stationary and the wafer is scanned relative to the ion beam mechanically to ensure all parts of the wafer receive an equal dose. Examples of the invention may also be applicable to arrangements in which the ion beam itself is scanned, magnetically or electrostatically, in at least one direction. Then, the tube for axially receiving and passing the ion beam, which is located in front of the substrate position, is adapted to accommodate the scanned beam. Thus, for a beam scanned in one direction orthogonal to the beam direction, the tube may be laterally extended in the beam scanning direction.

What is claimed is:

1. Electron flood apparatus for neutralising positive charge build-up on a substrate during implantation of ions in the substrate by ion beam implantation apparatus, comprising:

a tube for axially receiving and passing an ion beam to a substrate, the tube having an opening in a sidewall thereof, a plasma chamber having an exit aperture in communication with said opening of said tube, a supply of inert gas to said plasma chamber, a high frequency (h.f.) power generator, and means to deliver h.f. power from said generator to maintain a plasma in said chamber to produce low energy electrons, whereby a flux of said low energy electrons emerges from said chamber through said exit aperture into said tube to merge with the ion beam, said plasma chamber being made of refractory dielectric material, and having an electrically conducting shield on an exterior wall portion of said dielectric material of the chamber around said exit aperture, said shield being arranged to conduct away any electrostatic charge which could otherwise accumulate on the dielectric chamber wall around the exit aperture.

2. Electron flood apparatus as claimed in claim 1, wherein said means to deliver h.f. power comprises electrodes within said chamber to couple radio frequency (r.f.) power capacitatively to said plasma.

3. Electron flood apparatus as claimed in claim 2 including means providing a magnetic field in the chamber to confine the electrons in the plasma.

4. Electron flood apparatus as claimed in claim 1, wherein said means to deliver h.f. power comprises a coil surrounding the plasma chamber to couple r.f. power inductively to said plasma.

5. Electron flood apparatus as claimed in claim 1 wherein said means to deliver h.f. power comprises a magnetron to produce microwave energy and a waveguide to deliver microwave power from said magnetron to said plasma chamber.

6. Electron flood apparatus as claimed in claim 1 including an electrode within said chamber connected to conduct a positive current to ground from ions discharging on the electrode, whereby electron flux through said exit aperture is controlled.

7. Electron flood apparatus as claimed in claim 6, wherein said electrode is biased at a negative voltage relative to the substrate potential.

8. Electron flood apparatus as claimed in claim 6, wherein said electrode is located in said plasma chamber opposite said exit aperture.

9. Electron flood apparatus as claimed in claim 1 including a plasma ignitor in said plasma chamber.

10. Electron flood apparatus as claimed in claim 1, wherein said shield is connected to the substrate potential.

11. Electron flood apparatus as claims in claim 1, wherein said shield is connected to said tube.

12. Electron flood apparatus as claimed in claim 1 wherein said tube is biased at a negative voltage relative to the substrate potential.

13. Electron flood apparatus for neutralising positive charge build-up on a substrate during implantation of ions in the substrate by ion beam implantation apparatus, comprising:

a tube for axially receiving and passing an ion beam to a substrate, the tube having an opening in a sidewall thereof, a plasma chamber having an exit aperture in communication with said opening of said tube, a supply of inert gas to said plasma chamber, a high frequency (h.f.) power generator, and means to deliver h.f. power from said generator to maintain a plasma in said chamber to produce low energy electrons, whereby a flux of said low energy electrons emerges from said chamber through said exit aperture into said tube to merge with the ion beam, said tube being biased at a negative voltage relative to the substrate potential.

14. Electron flood apparatus for neutralising positive charge build-up on a substrate during implantation of ions in the substrate by ion beam implantation apparatus, comprising:

a tube for axially receiving and passing an ion beam to a substrate, the tube having an opening in a sidewall thereof, a plasma chamber having an exit aperture in communication with said opening of said tube, said plasma chamber being made of a refractory dielectric material, a supply of inert gas to said plasma chamber, a high frequency (h.f.) power generator, and means to deliver h.f. power from said generator to maintain a plasma in said chamber to produce low energy electrons, whereby a flux of said low energy electrons emerges from said chamber through said exit aperture into said tube to merge with the ion beam, and an electrode within said chamber connected to conduct a positive current to ground from ions discharging on the electrode, whereby electron flux through said exit aperture is controlled.

15. Electron flood apparatus as claimed in claim 14, wherein said means to delivery h.f. power comprises a coil surrounding the plasma chamber to couple r.f. power inductively to said plasma.

16. Electron flood apparatus as claimed in claim 14, wherein said electrode is biased at a negative voltage relative to the substrate potential.

17. Electron flood apparatus as claimed in claim 14, wherein said electrode is located in said plasma chamber opposite said exit aperture.

18. Electron flood apparatus as claimed in claim 14, including a plasma ignitor in said plasma chamber.

19. Electron flood apparatus as claimed in claim 14, wherein said plasma chamber has an electrically conducting shield on an exterior or wall portion of the chamber around said exit aperture, said shield being arranged to conduct away any electrostatic charge which could otherwise accumulate on the chamber wall around the exit aperture.

20. Electron flood apparatus as claimed in claim 19, wherein said shield is connected to the substrate potential.

21. Electron flood apparatus as claimed in claim 19, wherein said shield is connected to said tube.

\* \* \* \* \*